United States Patent
Takeuchi

(10) Patent No.: US 12,308,229 B2
(45) Date of Patent: May 20, 2025

(54) METHOD FOR MAKING MEMORY DEVICE INCLUDING A SUPERLATTICE GETTERING LAYER

(71) Applicant: Atomera Incorporated, Los Gatos, CA (US)

(72) Inventor: Hideki Takeuchi, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 18/761,691

(22) Filed: Jul. 2, 2024

(65) Prior Publication Data

US 2025/0014896 A1   Jan. 9, 2025

Related U.S. Application Data

(60) Provisional application No. 63/511,721, filed on Jul. 3, 2023.

(51) Int. Cl.
| | |
|---|---|
| *H10B 41/27* | (2023.01) |
| *H01L 21/02* | (2006.01) |

(Continued)

(52) U.S. Cl.
CPC .. *H01L 21/02507* (2013.01); *H01L 21/28079* (2013.01); *H01L 21/3221* (2013.01);
(Continued)

(58) Field of Classification Search
CPC ........... H01L 21/02507; H01L 21/3221; H01L 21/28079; H10B 41/35; H10B 41/27; H10B 43/27
See application file for complete search history.

(56) References Cited

U.S. PATENT DOCUMENTS

| | | | |
|---|---|---|---|
| 4,937,204 | A | 6/1990 | Ishibashi et al. |
| 5,216,262 | A | 6/1993 | Tsu |

(Continued)

FOREIGN PATENT DOCUMENTS

| | | |
|---|---|---|
| CN | 109742081 | 5/2019 |
| GB | 2347520 | 6/2000 |

OTHER PUBLICATIONS

Jin et al. "Nickel induced crystallization of amorphous silicon thin films" J. Appl. Phys. 84, 194-200 (1998).

(Continued)

*Primary Examiner* — Suberr L Chi
(74) *Attorney, Agent, or Firm* — ALLEN, DYER, DOPPELT, + GILCHRIST, P.A. Attorneys at Law

(57) ABSTRACT

A method for making a semiconductor device may include forming a superlattice gettering layer on a substrate. The superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. The method may also include forming a memory device above the superlattice gettering layer including a metal induced crystallization (MIC) channel adjacent the semiconductor substrate, and a gate associated with the MIC channel. The superlattice gettering layer may further include gettered metal particles from the MIC channel.

20 Claims, 10 Drawing Sheets

(51) Int. Cl.
  *H01L 21/28* (2006.01)
  *H01L 21/322* (2006.01)
  *H10B 41/35* (2023.01)
  *H10B 43/27* (2023.01)
  *H10D 62/815* (2025.01)
  *H10D 64/68* (2025.01)

(52) U.S. Cl.
  CPC ............ *H10B 41/27* (2023.02); *H10B 41/35* (2023.02); *H10B 43/27* (2023.02); *H10D 62/8162* (2025.01); *H10D 64/685* (2025.01)

(56) References Cited

U.S. PATENT DOCUMENTS

| | | | |
|---|---|---|---|
| 5,357,119 A | 10/1994 | Wang et al. | |
| 5,683,934 A | 11/1997 | Candelaria | |
| 5,796,119 A | 8/1998 | Seabaugh | |
| 5,811,844 A * | 9/1998 | Kuo | H01L 29/7785 |
| | | | 257/E29.25 |
| 6,376,337 B1 | 4/2002 | Wang et al. | |
| 6,447,933 B1 | 9/2002 | Wang et al. | |
| 6,472,685 B2 | 10/2002 | Takagi | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,402,512 B2 | 7/2008 | Derraa et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,535,041 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,716,147 B2 | 7/2017 | Mears | |
| 9,721,790 B2 | 8/2017 | Mears et al. | |
| 9,722,046 B2 | 8/2017 | Mears et al. | |
| 9,899,479 B2 | 2/2018 | Mears et al. | |
| 9,941,359 B2 | 4/2018 | Mears et al. | |
| 9,972,685 B2 | 5/2018 | Mears et al. | |
| 10,084,045 B2 | 9/2018 | Mears et al. | |
| 10,107,854 B2 | 10/2018 | Roy | |
| 10,109,342 B2 | 10/2018 | Roy | |
| 10,109,479 B1 | 10/2018 | Mears et al. | |
| 10,170,560 B2 | 1/2019 | Mears | |
| 10,170,603 B2 | 1/2019 | Mears et al. | |
| 10,170,604 B2 | 1/2019 | Mears et al. | |
| 10,191,105 B2 | 1/2019 | Roy | |
| 10,249,745 B2 | 4/2019 | Mears et al. | |
| 10,276,625 B1 | 4/2019 | Mears et al. | |
| 10,304,881 B1 | 5/2019 | Chen et al. | |
| 10,355,151 B2 | 7/2019 | Chen et al. | |
| 10,361,243 B2 | 7/2019 | Mears et al. | |
| 10,367,028 B2 | 7/2019 | Chen et al. | |
| 10,367,064 B2 | 7/2019 | Rao | |
| 10,381,242 B2 * | 8/2019 | Takeuchi | H01L 21/76898 |
| 10,396,223 B2 | 8/2019 | Chen et al. | |
| 10,410,880 B2 | 9/2019 | Takeuchi | |
| 10,453,945 B2 | 10/2019 | Mears et al. | |
| 10,461,118 B2 | 10/2019 | Chen et al. | |
| 10,468,245 B2 | 11/2019 | Weeks et al. | |
| 10,529,757 B2 | 1/2020 | Chen et al. | |
| 10,529,768 B2 | 1/2020 | Chen et al. | |
| 10,566,191 B1 | 2/2020 | Weeks et al. | |
| 10,580,866 B1 | 3/2020 | Takeuchi et al. | |
| 10,580,867 B1 | 3/2020 | Takeuchi et al. | |
| 10,593,761 B1 | 3/2020 | Takeuchi et al. | |
| 10,608,027 B2 | 3/2020 | Chen et al. | |
| 10,608,043 B2 | 3/2020 | Chen et al. | |
| 10,615,209 B2 | 4/2020 | Chen et al. | |
| 10,636,879 B2 | 4/2020 | Rao | |
| 10,727,049 B2 | 7/2020 | Weeks et al. | |
| 10,741,436 B2 | 8/2020 | Stephenson et al. | |
| 10,763,370 B2 | 9/2020 | Stephenson | |
| 10,777,451 B2 | 9/2020 | Stephenson et al. | |
| 10,811,498 B2 | 10/2020 | Weeks et al. | |
| 10,818,755 B2 | 10/2020 | Takeuchi et al. | |
| 10,825,901 B1 | 11/2020 | Burton et al. | |
| 10,825,902 B1 | 11/2020 | Burton et al. | |
| 10,840,335 B2 | 11/2020 | Takeuchi et al. | |
| 10,840,336 B2 | 11/2020 | Connelly et al. | |
| 10,840,337 B2 | 11/2020 | Takeuchi et al. | |
| 10,840,388 B1 | 11/2020 | Burton et al. | |
| 10,847,618 B2 | 11/2020 | Takeuchi et al. | |
| 10,854,717 B2 | 12/2020 | Takeuchi et al. | |
| 10,868,120 B1 | 12/2020 | Burton et al. | |
| 10,879,356 B2 | 12/2020 | Stephenson et al. | |
| 10,879,357 B1 | 12/2020 | Burton et al. | |
| 10,884,185 B2 | 1/2021 | Stephenson | |
| 10,937,868 B2 | 3/2021 | Burton et al. | |
| 10,937,888 B2 | 3/2021 | Burton et al. | |
| 11,075,078 B1 | 7/2021 | Cody et al. | |
| 11,094,818 B2 | 8/2021 | Takeuchi et al. | |
| 11,107,823 B2 | 8/2021 | Hu et al. | |
| 11,177,351 B2 | 11/2021 | Weeks et al. | |
| 11,183,565 B2 | 11/2021 | Burton et al. | |
| 11,302,823 B2 | 4/2022 | Weeks et al. | |
| 11,329,154 B2 | 5/2022 | Takeuchi et al. | |
| 11,355,667 B2 | 6/2022 | Stephenson | |
| 11,362,182 B2 | 6/2022 | Shin et al. | |
| 11,387,325 B2 | 7/2022 | Stephenson et al. | |
| 11,430,869 B2 | 8/2022 | Weeks et al. | |
| 11,437,486 B2 | 9/2022 | Burton | |
| 11,437,487 B2 | 9/2022 | Burton | |
| 11,469,302 B2 | 10/2022 | Takeuchi et al. | |
| 11,569,368 B2 | 1/2023 | Takeuchi et al. | |
| 11,631,584 B1 | 4/2023 | Hytha et al. | |

(56) References Cited

U.S. PATENT DOCUMENTS

| | | |
|---|---|---|
| 11,664,427 B2 | 5/2023 | Stephenson et al. |
| 11,664,459 B2 | 5/2023 | Stephenson |
| 11,682,712 B2 | 6/2023 | Hytha et al. |
| 11,721,546 B2 | 8/2023 | Hytha et al. |
| 11,728,385 B2 | 8/2023 | Hytha et al. |
| 11,742,202 B2 | 8/2023 | Takeuchi et al. |
| 11,810,784 B2 | 11/2023 | Hytha et al. |
| 11,837,634 B2 | 12/2023 | Weeks et al. |
| 11,848,356 B2 | 12/2023 | Weeks et al. |
| 11,869,968 B2 | 1/2024 | Takeuchi et al. |
| 11,923,418 B2 | 3/2024 | Hytha et al. |
| 11,923,431 B2 | 3/2024 | Burton |
| 11,935,940 B2 | 3/2024 | Burton |
| 11,978,771 B2 | 5/2024 | Weeks et al. |
| 12,014,923 B2 | 6/2024 | Takeuchi et al. |
| 12,020,926 B2 | 6/2024 | Takeuchi et al. |
| 12,046,470 B2 | 7/2024 | Hytha et al. |
| 2003/0034529 A1 | 2/2003 | Fitzgerald et al. |
| 2003/0057416 A1 | 3/2003 | Currie et al. |
| 2004/0262594 A1 | 12/2004 | Mears et al. |
| 2004/0266116 A1 | 12/2004 | Mears |
| 2005/0029510 A1 | 2/2005 | Mears et al. |
| 2005/0032241 A1 | 2/2005 | Mears et al. |
| 2005/0279991 A1 | 12/2005 | Mears et al. |
| 2005/0282330 A1 | 12/2005 | Mears et al. |
| 2006/0011905 A1 | 1/2006 | Mears et al. |
| 2006/0220118 A1 | 10/2006 | Stephenson et al. |
| 2006/0223215 A1 | 10/2006 | Blanchard |
| 2006/0231857 A1 | 10/2006 | Blanchard |
| 2006/0243964 A1 | 11/2006 | Kreps et al. |
| 2006/0263980 A1 | 11/2006 | Kreps et al. |
| 2006/0267130 A1 | 11/2006 | Rao |
| 2006/0273299 A1 | 12/2006 | Stephenson et al. |
| 2006/0289049 A1 | 12/2006 | Rao |
| 2006/0292765 A1 | 12/2006 | Blanchard |
| 2007/0010040 A1 | 1/2007 | Mears et al. |
| 2007/0012910 A1 | 1/2007 | Mears et al. |
| 2007/0015344 A1 | 1/2007 | Mears et al. |
| 2007/0020833 A1 | 1/2007 | Mears et al. |
| 2007/0020860 A1 | 1/2007 | Mears et al. |
| 2007/0063185 A1 | 3/2007 | Rao |
| 2007/0063186 A1 | 3/2007 | Rao |
| 2007/0158640 A1 | 7/2007 | Stephenson et al. |
| 2007/0166928 A1 | 7/2007 | Halilov et al. |
| 2007/0187667 A1 | 8/2007 | Halilov et al. |
| 2008/0012004 A1 | 1/2008 | Huang et al. |
| 2010/0270535 A1 | 10/2010 | Halilov et al. |
| 2011/0215299 A1 | 9/2011 | Rao |
| 2019/0058059 A1 | 2/2019 | Stephenson et al. |
| 2020/0135489 A1 | 4/2020 | Weeks et al. |
| 2022/0005706 A1 | 1/2022 | Weeks et al. |
| 2022/0278204 A1 | 9/2022 | Shin et al. |
| 2022/0352322 A1 | 11/2022 | Hytha et al. |
| 2022/0367676 A1 | 11/2022 | Burton |
| 2022/0376047 A1 | 11/2022 | Mears et al. |
| 2022/0384600 A1 | 12/2022 | Mears et al. |
| 2023/0122723 A1 | 4/2023 | Weeks et al. |
| 2023/0361178 A1 | 11/2023 | Hytha et al. |
| 2023/0411491 A1 | 12/2023 | Hytha et al. |
| 2023/0411557 A1 | 12/2023 | Hytha et al. |
| 2024/0063268 A1 | 2/2024 | Weeks et al. |
| 2024/0072095 A1 | 2/2024 | Takeuchi et al. |
| 2024/0072096 A1 | 2/2024 | Takeuchi et al. |
| 2024/0097003 A1 | 3/2024 | Burton |
| 2024/0097026 A1 | 3/2024 | Takeuchi et al. |
| 2024/0170539 A1 | 5/2024 | Hytha et al. |
| 2024/0194482 A1 | 6/2024 | Hytha et al. |
| 2024/0194740 A1 | 6/2024 | Weeks et al. |
| 2024/0250146 A1 | 7/2024 | Burton |

OTHER PUBLICATIONS

Chris Mellor Extensive 3D NAND drives very expensive to make https://www.theregister.com/2015/04/09/3d_nand_gigantically_expensive_to_make/ Apr. 9, 2015 pp. 4.

Aiba et al. "Demonstration of Recovery Annealing on 7-Bits per Cell 3D Flash Memory at Cryogenic Operation for Bit Cost Scalability and Sustainability" 2023 IEEE Symposium on VLSI Technology and Circuits (VLSI Technology and Circuits) Jun. 2023 Abstract Only.

U.S. Appl. No. 18/761,610, filed Jul. 2, 2024 Hideki Takeuchi.

R. Tsu "Phenomena in silicon nanostructure device" published online Sep. 6, 2000 by Applied Physics and Materials Science & Processing, pp. 391-402.

Xu et al., "MOSFET performance and scalability enhancement by insertion of oxygen layers", Department of Electrical Engineering and Computer Science, University of California, Berkeley, 2012, pp. 1-4.

Luo et al., "Chemical Design of Direct-Gap Light-Emitting Silicon" published in Physical Review Letters, vol. 89, No. 7; Aug. 12, 2002; 4 pgs.

R. Tsu "Si Based Green ELD: Si-Oxygen Superlattice" ysiwyg://1/ http://www3.interscience.wiley.com/cgi-bin/abstract/72512946/start: published online Jul. 21, 2000; 2 pgs. Abstract Only.

Novikov et al. "Silicon-based Optoelectronics" 1999-2003, pp. 1-6.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Maurizio Di Paolo Emilio "Quantum-Engineered Material Boosts Transistor Performance" https://www.eetimes.com/quantum-engineered-material-boosts-transistor-performance/# EE Times; retreived from internet Feb. 10, 2022; pp. 3.

* cited by examiner

METHOD FOR MAKING MEMORY DEVICE INCLUDING A SUPERLATTICE GETTERING LAYER

CROSS-REFERENCE TO RELATED APPLICATIONS

This application claims the benefit of U.S. provisional app. No. 63/511,721 filed Jul. 3, 2023, which is hereby incorporated herein in its entirety by reference.

TECHNICAL FIELD

The present disclosure generally relates to semiconductor devices, and, more particularly, to semiconductor memory devices and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming a superlattice gettering layer on a semiconductor substrate. The superlattice may include a plurality of stacked groups of layers, with each group of layers including a plurality of stacked base semiconductor monolayers defining a base semiconductor portion, and at least one non-semiconductor monolayer constrained within a crystal lattice of adjacent base semiconductor portions. The method may also include forming a memory device above the superlattice gettering layer including a metal induced crystallization (MIC) channel adjacent the semiconductor substrate, and a gate associated with the MIC channel. The superlattice gettering layer may further include gettered metal particles from the MIC channel.

In an example embodiment, forming the memory device may comprise forming a NAND memory device. By way of example, the channel may be a vertical MIC channel extending vertically upward from the substrate. Furthermore, the gate may include a stack of alternating gate insulator layers and gate electrode layers, and each gate electrode layer may comprise a tungsten gate electrode.

In some embodiments, the method may further include forming a doped diffusion layer in the semiconductor substrate, and forming the superlattice gettering layer may comprise forming the superlattice gettering layer within the doped diffusion layer. In an example implementation, the method may further include forming an oxide-nitride-oxide liner between the gate and the MIC channel. By way of example, the gettered metal particles may comprise nickel particles. Also by way of example, the base semiconductor monolayers may comprise silicon, and the non-semiconductor monolayers may comprise oxygen.

DETAILED DESCRIPTION

Figure 1:
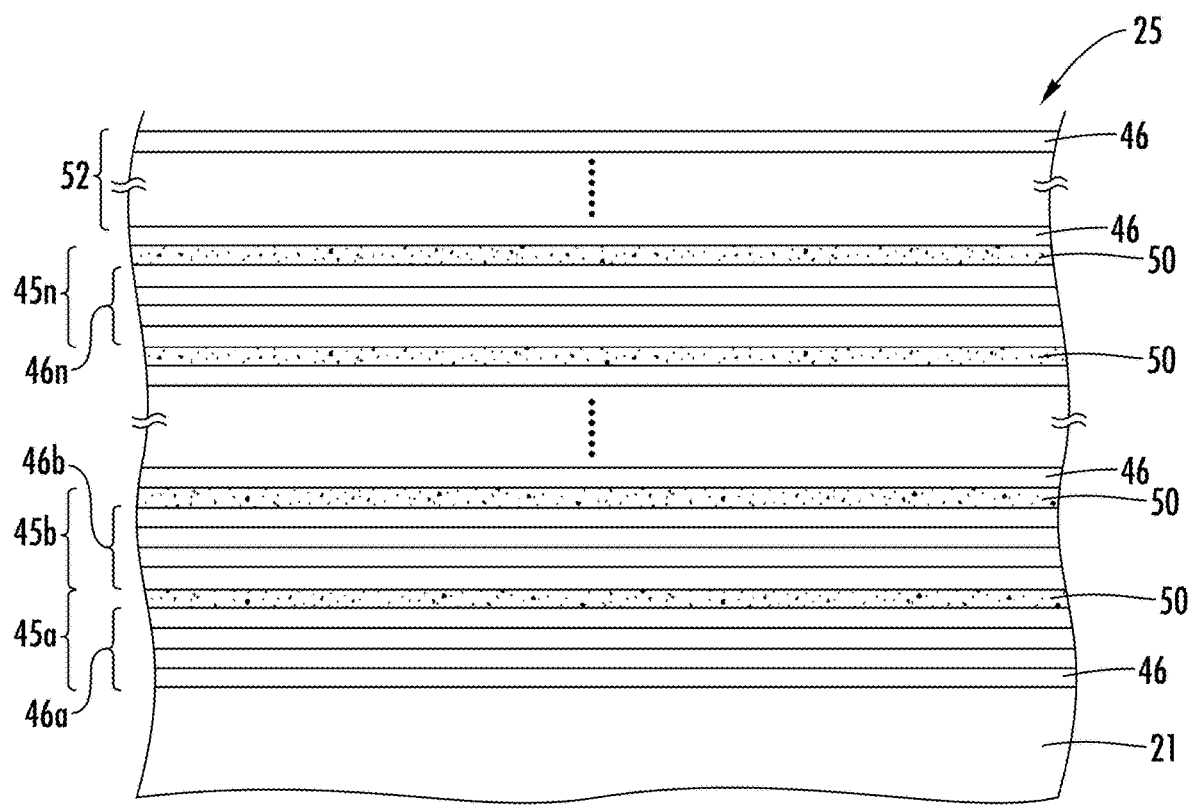
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to semiconductor devices having an enhanced semiconductor superlattice therein to provide performance enhancement characteristics. The enhanced semiconductor superlattice may also be referred to as an "MST" layer or "MST technology" in this disclosure.

More particularly, the MST technology relates to advanced semiconductor materials such as the superlattice 25 described further below. In prior work, Applicant theorized that certain superlattices as described herein reduce the effective mass of charge carriers and that this thereby leads to higher charge carrier mobility. See, e.g., U.S. Pat. No. 6,897,472, which is hereby incorporate herein in its entirety by reference.

Further development by Applicant has established that the presence of MST layers may advantageously improve the mobility of free carriers in semiconductor materials, e.g., at interfaces between silicon and insulators like $SiO_2$ or $HfO_2$. Applicant theorizes, without wishing to be bound thereto, that this may occur due to various mechanisms. One mechanism is by reducing the concentration of charged impurities proximate to the interface, by reducing the diffusion of these impurities, and/or by trapping the impurities so they do not reach the interface proximity. Charged impurities cause Coulomb scattering, which reduces mobility. Another mechanism is by improving the quality of the interface. For example, oxygen emitted from an MST film may provide oxygen to a Si—$SiO_2$ interface, reducing the presence of sub-stoichiometric $SiO_x$. Alternately, the trapping of interstitials by MST layers may reduce the concentration of interstitial silicon proximate to the Si—$SiO_2$ interface, reducing the tendency to form sub-stoichiometric $SiO_x$. Sub-stoichiometric $SiO_x$ at the Si—$SiO_2$ interface is known to exhibit inferior insulating properties relative to stoichiometric $SiO_2$. Reducing the amount of sub-stoichiometric $SiO_x$ at the interface may more effectively confine free carriers (electrons or holes) in the silicon, and thus improve the mobility of these carriers due to electric fields applied parallel to the interface, as is standard practice in field-effect-transistor ("FET") structures. Scattering due to the direct influence of the interface is called "surface-roughness scattering", which may advantageously be reduced by the proximity of MST layers followed by anneals or during thermal oxidation.

In addition to the enhanced mobility characteristics of MST structures, they may also be formed or used in such a manner that they provide piezoelectric, pyroelectric, and/or ferroelectric properties that are advantageous for use in a variety of different types of devices, as will be discussed further below.

Figure 2:
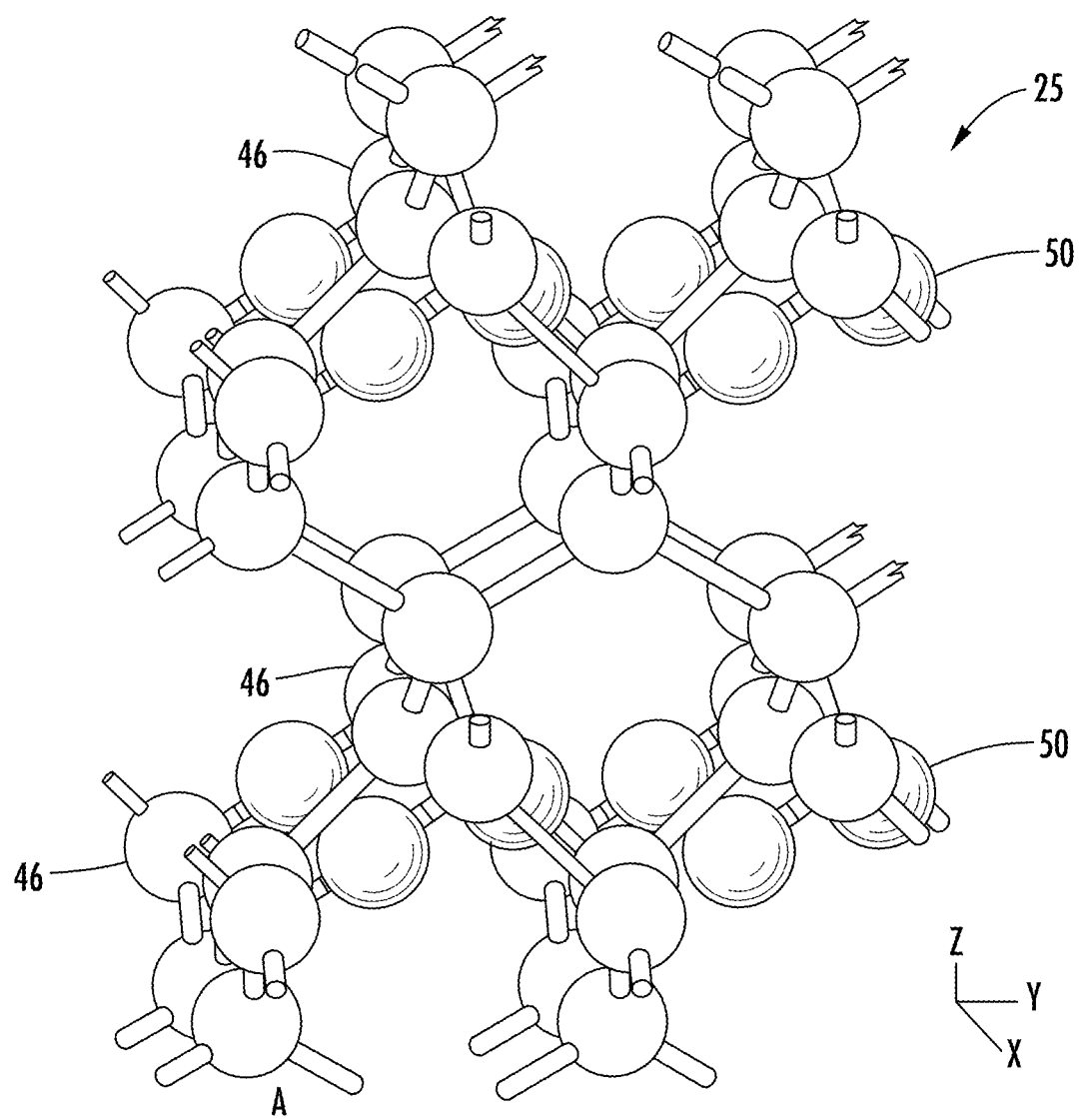
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and a non-semiconductor monolayer(s) 50 thereon. The non-semiconductor monolayers 50 are indicated by stippling in FIG. 1 for clarity of illustration.

The non-semiconductor monolayer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that non-semiconductor monolayers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present embodiments, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each non-semiconductor monolayer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the non-semiconductor monolayer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the embodiments may be readily adopted and implemented, as will be appreciated by those skilled in the art.

Figure 3:
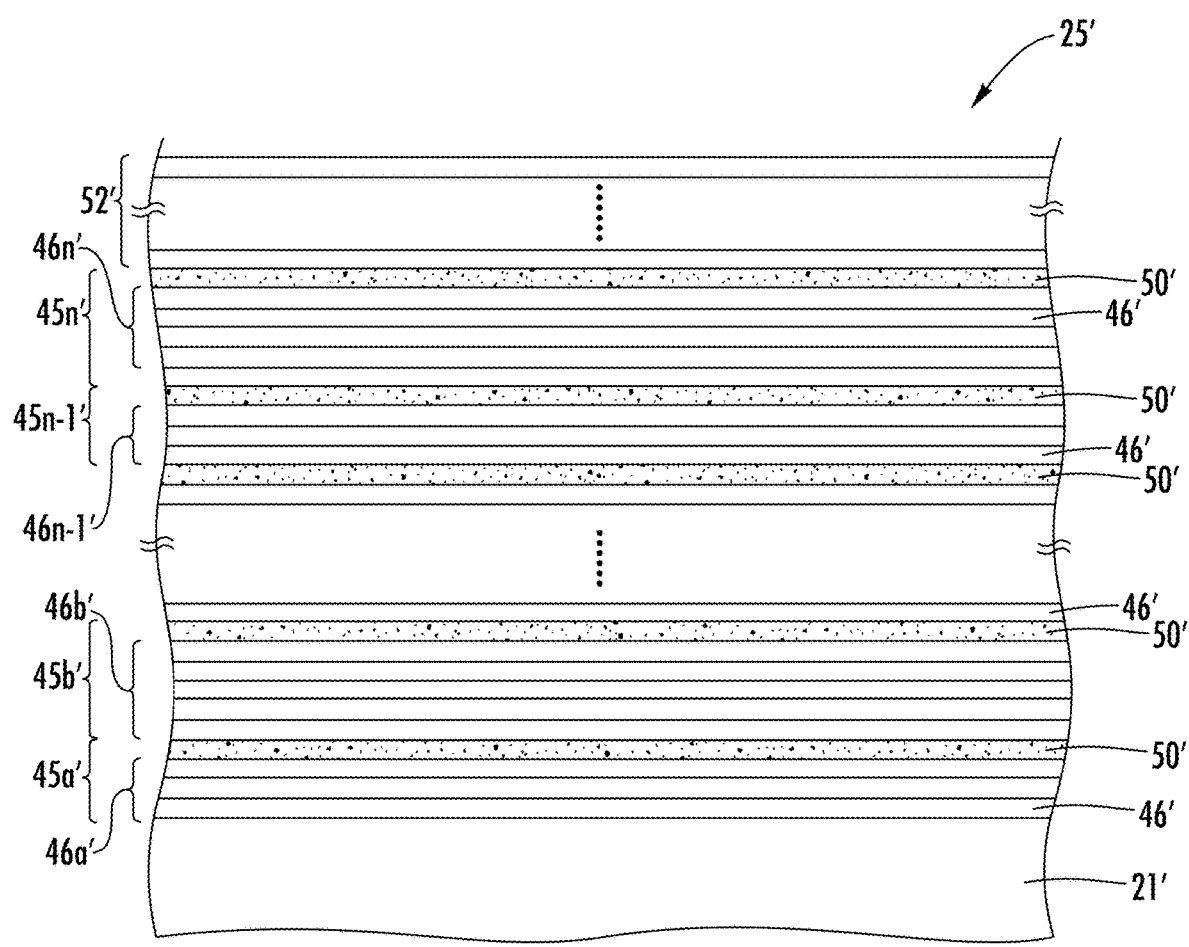
FIG. 3 is a greatly enlarged schematic cross-sectional view of another embodiment of a superlattice in accordance with an example embodiment.

Referring now additionally to FIG. 3, another embodiment of a superlattice 25' in accordance with the embodiments having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The non-semiconductor monolayers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4:
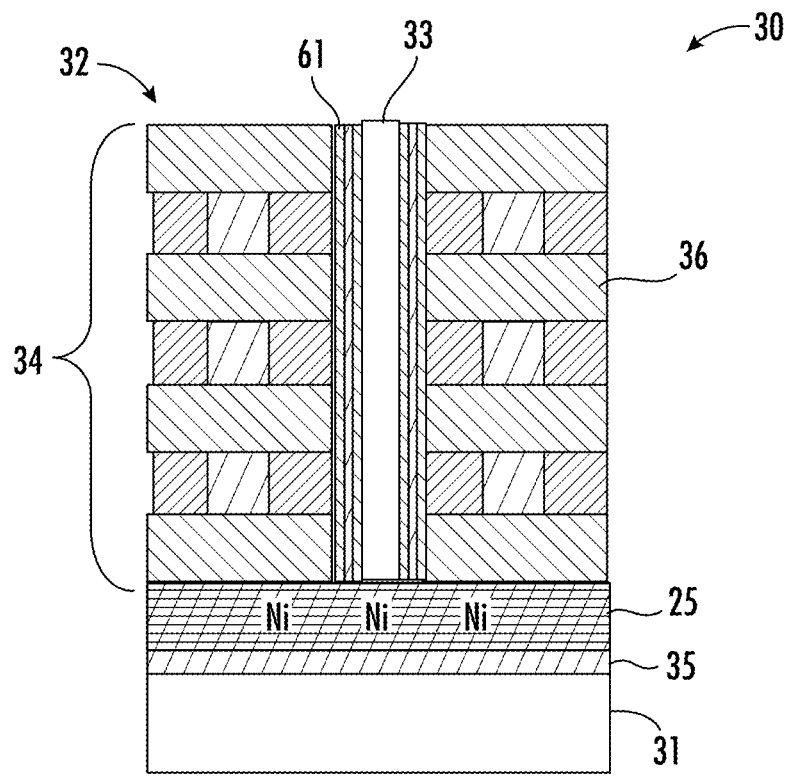
FIG. 4 is cross-sectional diagram of a memory device including a superlattice gettering layer in accordance with an example embodiment.

Turning now to FIG. 4, a semiconductor device 30 which incorporates the above-described MST structures as a gettering layer for metal induced crystallization (MIC) processing is now described. By way of background, various approaches have been used for 3D NAND memory devices and fabrication. For example, in Y. Aiba, et al., "Demonstration of recovery annealing on 7-bits per cell 3D flash memory at cryogenic operation for bit cost scalability and sustainability", T3-3, VLSI Symposium 2023, a significant improvement in 3D NAND device performance was reported for an epitaxial (epi) Si channel over conventional poly-Si channel, where amorphous silicon (a-Si) is converted to crystalline Si using the MIC technique. In another example (Z. Jin, et al., "Nickel induced crystallization of amorphous silicon thin films", p. 194, J. Appl. Phys. 1998), it was reported that 5-10 nm of a Ni layer deposited on 1 μm a-Si can convert the a-Si layer into crystalline Si in a subsequent anneal at 500° C. for 1 hr., while Ni diffuses through the a-Si layer.

While such techniques provide enhanced channel performance, because an MIC-based 3D-NAND epi Si channel relies on rapid diffusion of Ni atoms, diffused Ni needs to be contained or removed so that it does not diffuse into other transistor regions on the Si substrate. Otherwise, this could lead to undesirable crystalline defects, resulting in significant yield reduction.

The semiconductor device 30 illustratively includes a semiconductor substrate 31 and a memory device 32 on the semiconductor substrate including an MIC channel 33 adjacent the semiconductor substrate, and a gate 34 associated with the MIC channel. In the present example, the memory device 32 is a 3D vertical NAND memory device, although in other embodiments different types of memory devices may be used (e.g., 3D horizontal channel NAND, 3D NOR memory devices, etc.). The semiconductor device 30 further illustratively includes a superlattice gettering layer 25, such as the MST layers described above, between the semiconductor substrate 31 and the MIC channel 33. The superlattice gettering layer 25 advantageously getters metal particles (Ni in the example illustrated in FIG. 4) from the MIC channel resulting from the rapid diffusion of metal (e.g., Ni) during MIC processing.

Referring additionally to FIGS. 5A-5J, an example method for making the semiconductor device 30 of FIG. 4 is now described. The method begins with forming an MST layer 25 on the silicon substrate 31 (FIG. 5A), as discussed further above. By way of example, the MST layer 25 may have a thickness in a range of 5-500 nm, for example. An implant layer 35 is then formed through the implantation of a dopant. In the present example, this is an N+ layer implant 35 (P 10 keV $3\times10^{15}$, for example) accompanied by a rapid thermal anneal (RTA) (e.g., 1000° C. for 5 s).

Figure 5A:
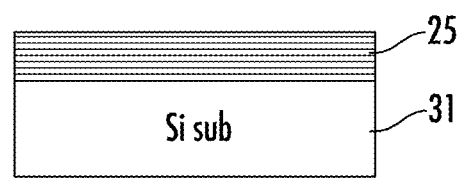
FIGS. 5A-5J are a series of cross-sectional diagrams illustrating an example method for making the memory device of FIG. 4.
Figure 5B:
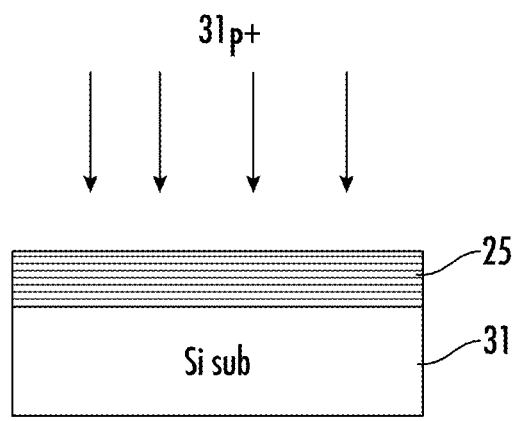
Figure 5C:
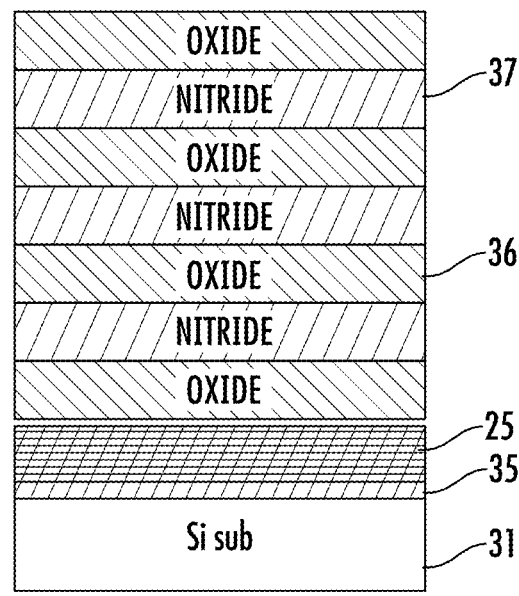
Figure 5D:
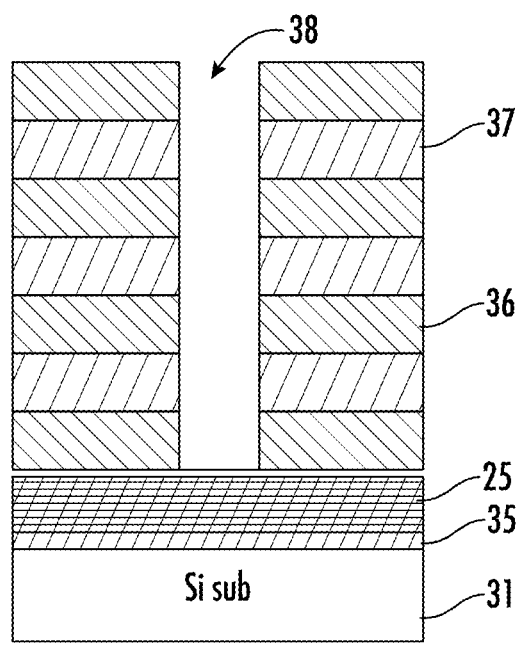
Figure 5E:
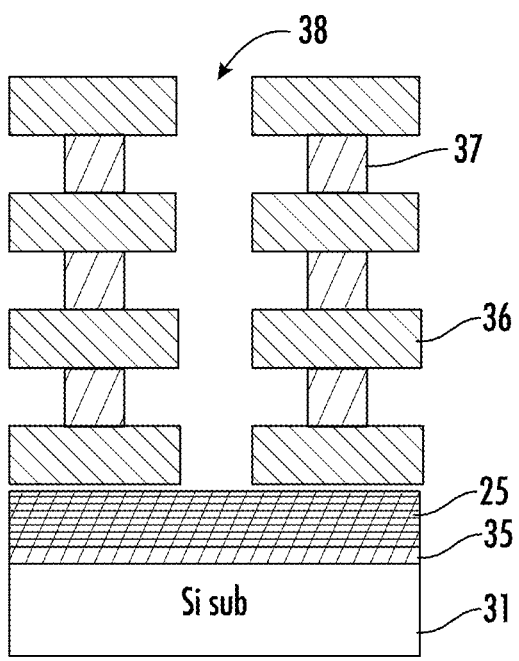

Following the implant layer 35 formation, a stack of alternating oxide and nitride films 36, 37 is formed (FIG. 5C). In the illustrated example, the are four oxide layers 36 and three nitride layers 37 in the stack, although different numbers of layers may be used in different embodiments. Next, a trench 38 is etched in the film stack (FIG. 5D), followed by a partial recess of the nitride layers (FIG. 5E).

Figure 5F:
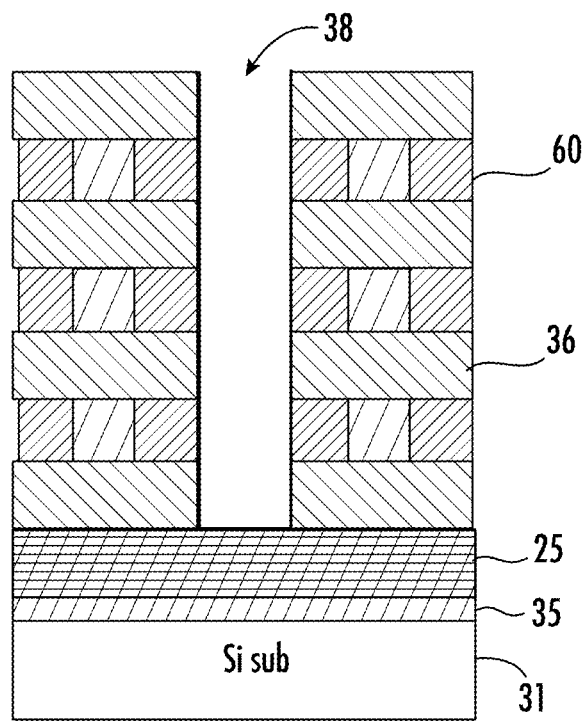
Figure 5G:
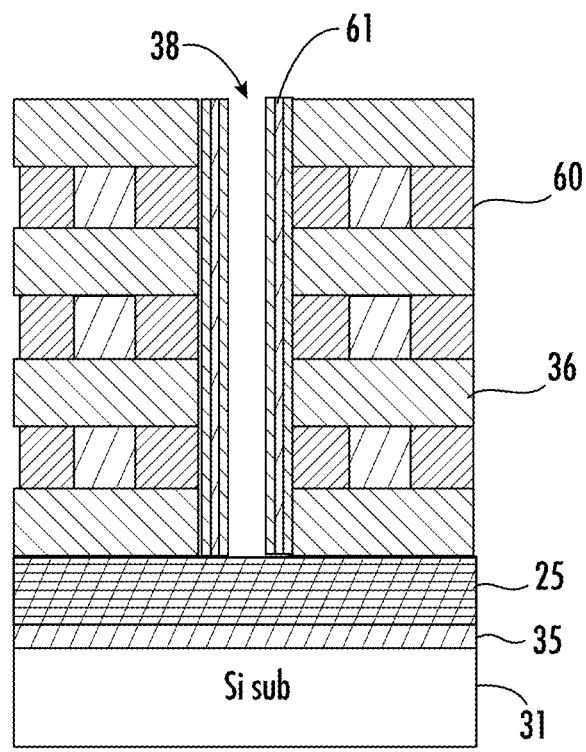
Figure 5H:
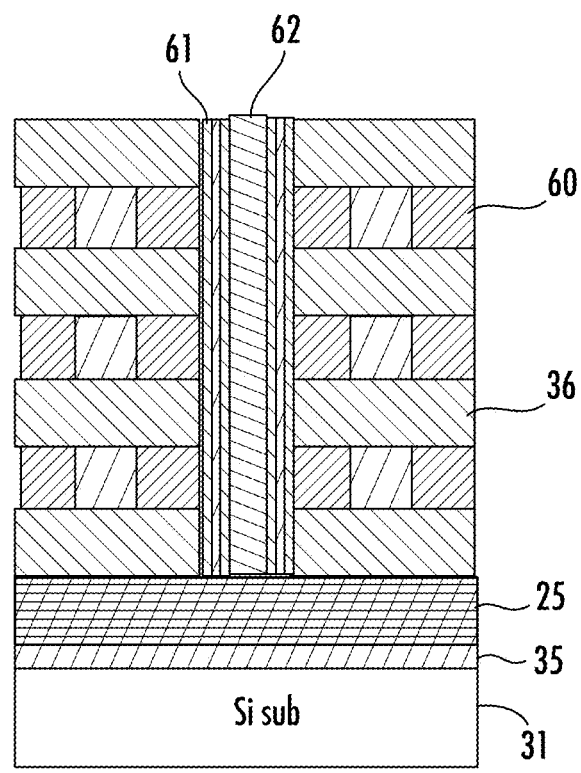

A metal gate electrode 60 deposition (e.g., tungsten (W)) may then be performed adjacent the nitride and etched back, as seen in FIG. 5F. A dielectric film 61 may then be formed in the trench 38 and etched back (FIG. 5G). By way of example, the dielectric film 61 may be an oxide-nitride-oxide (ONO) film, although other suitable dielectrics may be used in different embodiments. Next, a silicon channel 62, which is amorphous, may then be formed in the trench 38 on the liner 61, as seen in FIG. 5H.

Figure 5I:
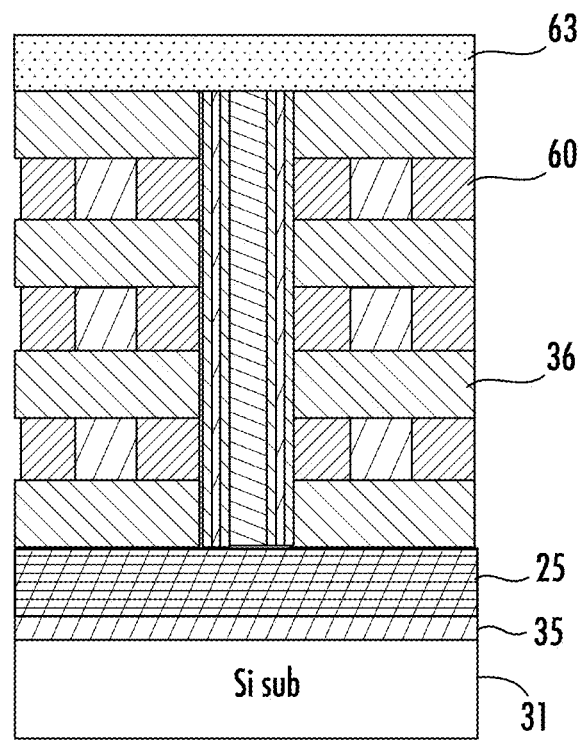
Figure 5J:
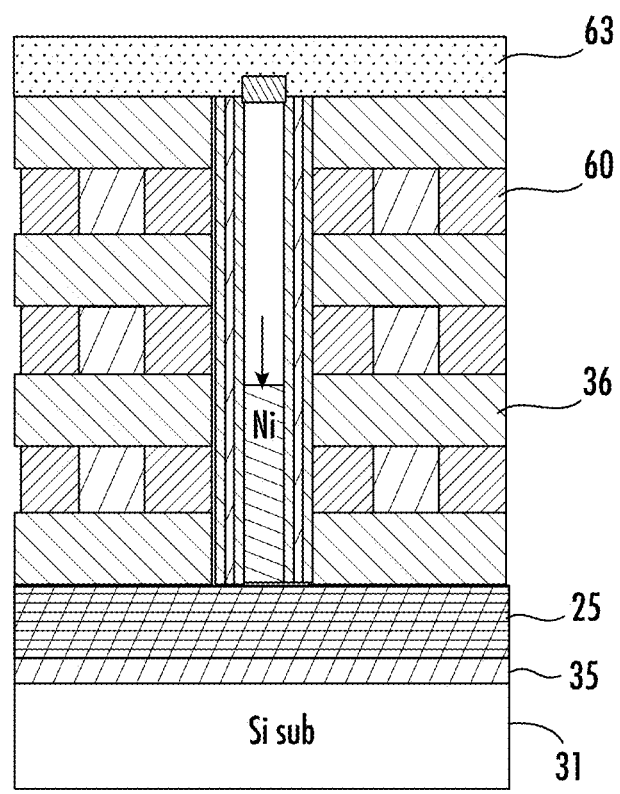

The MIC processing begins with the formation of a metal (here, Ni) layer 63 on the stack (FIG. 5I). By way of example, the metal layer 63 may have a thickness in a range of 5-10 nm, although different thicknesses may be used in different embodiments. Then an MIC anneal may be performed, which causes Ni diffusion through the a-Si of the channel 62 so that it crystalizes (FIG. 5J). As seen in FIG. 4, Ni from the MIC anneal which would otherwise diffuse into the substrate 31 (or other regions) is instead gettered or trapped by the MST layer 25, which resides inside of the diffusion layer 35. The surface Ni/NiSi layer 63 may then be removed, and further device processing performed as appropriate (e.g., contact formation, etc.), as will be appreciated by those skilled in the art.

Figure 6:
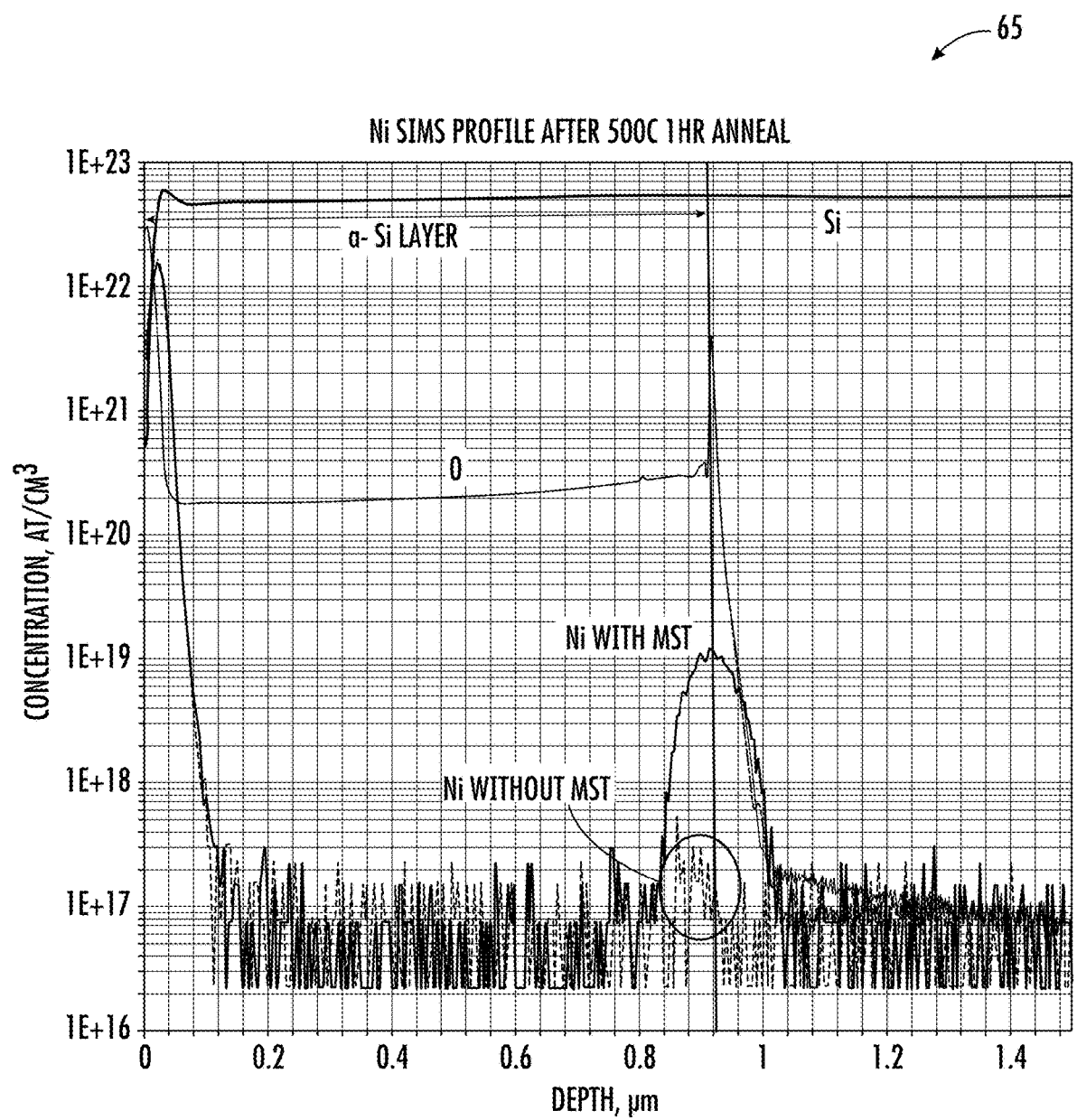
FIG. 6 is graph including SIMS profiles of Ni in the memory device of FIG. 4 with MST gettering layer, as well as in a similar device without the MST gettering layer.

The effectiveness of the above-described configuration was confirmed by the SIMS profiles shown in the graph 65 of FIG. 6. After depositing ~0.9 um of a-Si by LPCVD at 550° C., 10 nm of Ni film was deposited by evaporation. After a subsequent 500° C. 1 hr anneal emulating an MIC anneal, the Ni depth profile was measured. From the graph 65 it is evident that the Si substrate with the MST film contains the Ni diffused from the top surface at the a-Si/crystalline Si interface, as compared to the version with no MST gettering layer.

Another technical advantage of the above-described approach is that by implementing the MST layer 25 on starting wafers (e.g., as a blanked deposition across the wafer surface), periphery circuits in other regions will gain MST benefits. These benefits may include Vt variability improvement, mobility improvement, gate leakage reduction, and gate oxide reliability improvement, for example. Further details regarding the gettering capabilities of MST films is provided in U.S. Pat. No. 10,410,880 to Takeuchi, which is also assigned to the present Applicant and is hereby incorporated herein in its entirety by reference.

Many modifications and other embodiments of the invention will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included.

The invention claimed is:

1. A method for making a semiconductor device comprising:
    forming a superlattice gettering layer on a semiconductor substrate, the superlattice gettering layer comprising a plurality of stacked groups of layers, each of the plurality of stacked groups of layers comprising a plurality of stacked base semiconductor monolayers defining a base semiconductor portion, and at least one non-semiconductor monolayer constrained within a crystal lattice of adjacent base semiconductor portions; and
    forming a memory device above the superlattice gettering layer comprising a metal induced crystallization (MIC) channel adjacent the semiconductor substrate, and a gate associated with the MIC channel;
    the superlattice gettering layer further comprising gettered metal particles from the MIC channel.

2. The method of claim 1 wherein forming the memory device comprises forming a NAND memory device.

3. The method of claim 1 wherein the MIC channel comprises a vertical MIC channel extending vertically upward from the substrate.

4. The method of claim 3 wherein the gate comprises a stack of alternating gate insulator layers and gate electrode layers.

5. The method of claim 4 wherein each gate electrode layer comprises a tungsten gate electrode.

6. The method of claim 1 further comprising forming a doped diffusion layer in the semiconductor substrate, and wherein forming the superlattice gettering layer comprises forming the superlattice gettering layer within the doped diffusion layer.

7. The method of claim 1 further comprising forming an oxide-nitride-oxide liner between the gate and the MIC channel.

8. The method of claim 1 wherein the gettered metal particles comprise nickel particles.

9. The method of claim 1 wherein the base semiconductor monolayers comprise silicon.

10. The method of claim 1 wherein the non-semiconductor monolayers comprise oxygen.

11. A method for making a semiconductor device comprising:
    forming a superlattice gettering layer on the semiconductor substrate, the superlattice gettering layer comprising a plurality of stacked groups of layers, each of the plurality of stacked groups of layers comprising a plurality of stacked base semiconductor monolayers defining a base semiconductor portion, and at least one non-semiconductor monolayer constrained within a crystal lattice of adjacent base semiconductor portions; and forming a NAND memory device above the superlattice gettering layer and comprising a vertical metal induced crystallization (MIC) channel extending vertically upward from the semiconductor substrate, and a gate surrounding the vertical MIC channel;

the superlattice gettering layer further comprising gettered metal particles from the MIC channel, and the gettered metal particles comprising nickel.

12. The method of claim 11 wherein the gate comprises a stack of alternating gate insulator layers and gate electrode layers.

13. The method of claim 12 wherein each gate electrode layer comprises a tungsten gate electrode.

14. The method of claim 11 further comprising forming a doped diffusion layer in the semiconductor substrate, and wherein forming the superlattice gettering layer comprises forming the superlattice gettering layer within the doped diffusion layer.

15. The method of claim 11 further comprising forming an oxide-nitride-oxide liner between the gate and the MIC channel.

16. A method for making a semiconductor device comprising:

forming a superlattice gettering layer on a semiconductor substrate, the superlattice gettering layer comprising a plurality of stacked groups of layers, each of the plurality of stacked groups of layers comprising a plurality of stacked base silicon monolayers defining a base silicon portion, and at least one oxygen monolayer constrained within a crystal lattice of adjacent base silicon portions; and forming a memory device on the semiconductor substrate comprising a metal induced crystallization (MIC) channel adjacent the semiconductor substrate, and a gate associated with the MIC channel;

the superlattice gettering layer further comprising gettered metal particles from the MIC channel.

17. The method of claim 16 wherein forming the memory device comprises forming a NAND memory device.

18. The method of claim 16 wherein the MIC channel comprises a vertical MIC channel extending vertically upward from the substrate.

19. The method of claim 18 wherein the gate comprises a stack of alternating gate insulator layers and gate electrode layers.

20. The method of claim 19 wherein each gate electrode layer comprises a tungsten gate electrode.

* * * * *